United States Patent [19]

Sherwood

[11] 4,228,475

[45] Oct. 14, 1980

[54] GROUND MONITORING SYSTEM

[75] Inventor: John R. Sherwood, Arlington, Va.

[73] Assignee: AMF Incorporated, White Plains, N.Y.

[21] Appl. No.: 937,680

[22] Filed: Aug. 28, 1978

[51] Int. Cl.² .............................................. H02H 3/16
[52] U.S. Cl. ........................................ 361/47; 324/51
[58] Field of Search .................................... 361/47–50, 361/79; 340/652; 324/51

[56] References Cited

U.S. PATENT DOCUMENTS

| | | | |
|---|---|---|---|
| 3,676,739 | 7/1972 | Neuhouser | 361/48 |
| 3,728,582 | 4/1973 | Agnew | 361/48 |
| 3,783,340 | 1/1974 | Becker | 361/50 |
| 3,886,409 | 5/1975 | Scarpino | 361/48 |
| 4,075,675 | 2/1978 | Buckett et al. | 361/48 |

Primary Examiner—Harry E. Moose, Jr.
Attorney, Agent, or Firm—George W. Price; John H. Gallagher

[57] ABSTRACT

A ground monitoring circuit for detecting the existence and proper connection of the ground wires in an electrical power cable of a type commonly used at a surface mining site. A complete conductive loop is established between the ground conductor, or conductors, and the ground check, or pilot, wire of the cable. A sensing signal at a frequency higher than the power frequency is coupled onto the ground monitoring loop. The voltage and current in the loop are separately sampled. Various comparisons of the voltage and current samples are made to detect any deviation in the resistance and/or reactance characteristics of the loop. Any deviation from desired conditions in the loop produce one or more output signals that change the condition of a trip relay. The trip relay initiates action that ultimately opens circuit breakers to remove power from the cable.

18 Claims, 7 Drawing Figures

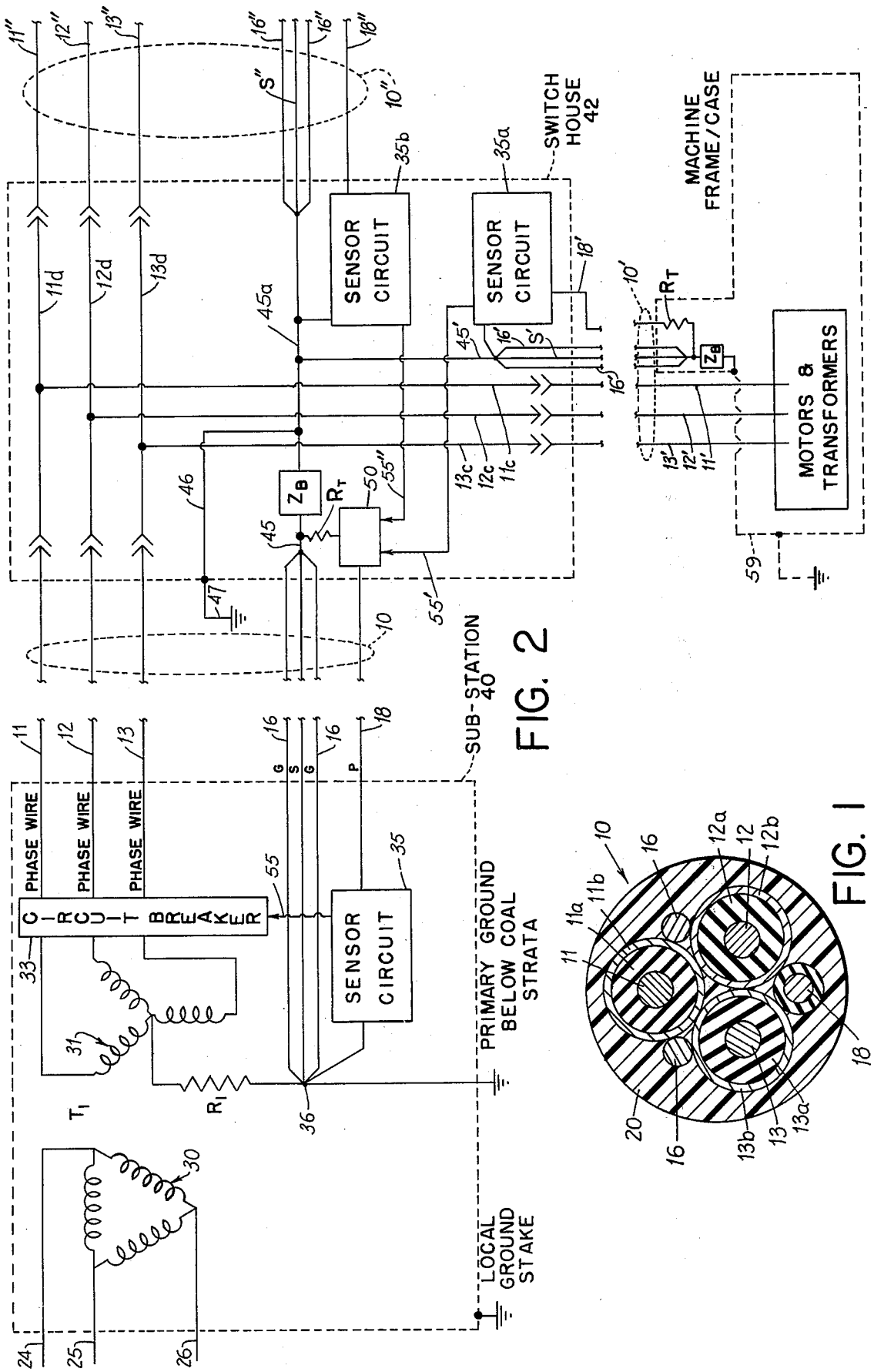

GROUND MONITORING SYSTEM

BACKGROUND OF THE INVENTION

The present invention relates to monitoring the ground circuit in an electrical power distribution system of a type that is commonly employed at a location where coal is mined from the surface; i.e., at a strip mine. In surface mining operations, extensive use is made of large electrically powered machinery such as power shovels, pumps, drills, etc. As an example, 600 volt to 25 kilovolt, three phase electrical service may be provided at a remote surface mining site. Electrical utility company power lines are brought to a substation at or close to the mining site. Because much of the mining machinery must be movable, long insulated power cables that can be dragged along the ground connect the machinery to mobile switch houses that in turn are connected to the substation by additional long insulated power cables. There are a number of different types of power cables used in surface mining. One such type of cable includes the three power conductors, each with a metallic shield about it, two bare ground conductors, and an insulated ground check wire that commonly is called a pilot wire. All are enclosed in an insulating elastomeric jacket. Typically, the cables are in 1,000 feet lengths. Two or more cables may be connected together.

If an insulation breakdown occurs in one of the large electrically powered pieces of machinery the entire machine may be at a dangerous high voltage unless it is protected by a suitable metallic ground circuit. In many instances the machine will be in contact with the earth, but because the machinery is moved around from place to place, a dependable earth ground resulting only from contact with the earth cannot be relied upon. Consequently, a metallic ground circuit in the power cable is essential. The Federal Coal Mine Health and Safety Act of 1969 requires that the electrical ground circuit in the power cable be continuously monitored to detect short circuits, open circuits, and abnormally high resistance conditions in the ground circuit. Upon detection of a fault condition the ground monitor must open one or more circuit breakers to disconnect the electrical source from the faulty portion of the system.

A ground monitor intended for use at a surface mining location must be able to detect the desired condition that it is the metallic ground conductor of the power cable that is providing ground continuity in the system and not an earth ground resulting from the machine being in contact with the earth or water.

BRIEF DESCRIPTION OF THE DRAWINGS

The invention will be described in connection with the accompanying drawings wherein:

FIG. 1 is an illustration of a type of power cable that is to be monitored by the apparatus of the present invention;

FIG. 2 is a simplified illustration of a representative power distribution system that might be found at a surface mine location, and includes the fault monitoring feature of the present invention;

DETAILED DESCRIPTION OF THE INVENTION

Figure 3:
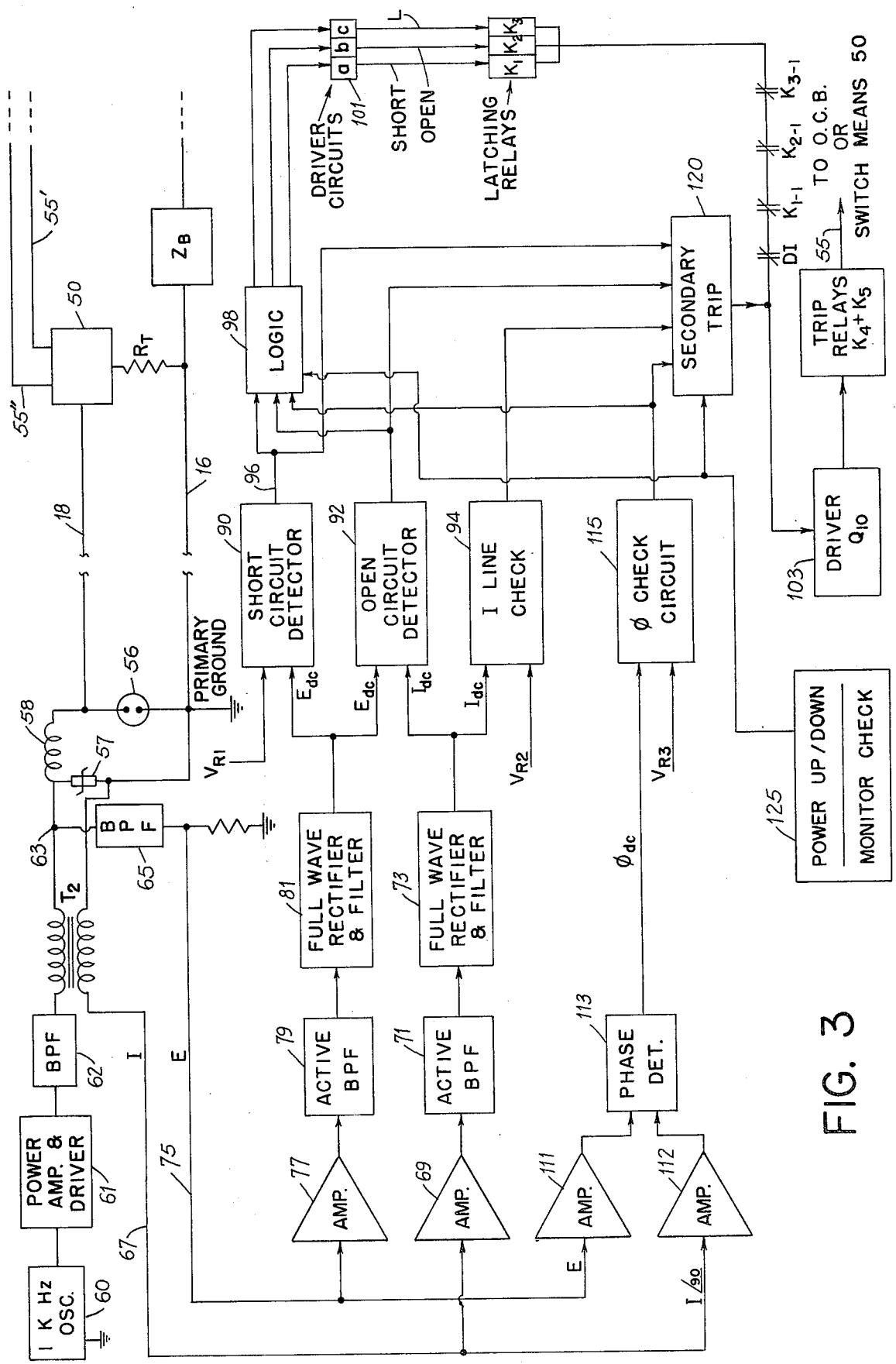
FIG. 3 is a simplified block diagram of the fault monitoring sensor circuit of the present invention.

FIG. 1 is a cross sectional representation of a typical electrical power distribution cable 10 of a type used to supply electrical power to machinery at a surface mine. The type chosen for representation is identified as SHD-GC-8KV to 25KV cable. Other types are available, but the type of FIG. 1 shall be used as the example throughout this description. The individual phase conductors 11, 12, and 13 are stranded metallic conductors and each is surrounded by respective insulating material 11a, 12a, and 13a, and by a respective stranded conductive shield 11b, 12b, and 13b. The cable also includes two bare stranded ground wires 16, and an insulated stranded ground check, or pilot wire 18. A jacket or sheath 20 of elastomeric insulation material surrounds all the conductors and wires.

Electrical power distribution systems at surface mine locations vary considerably. FIG. 2 is a simplified schematic illustration that may be considered to be representative of what might be found at a surface mine.

High voltage from the electric utility three phase system is coupled over open wires 24, 25, 26 to the delta connected primary windings 30 of transformer $T_1$ at the substation 40. The substation structure is grounded by a local ground stake, as indicated.

The secondary winding 31 of transformer $T_1$ is wye connected and its neutral point is connected through resistor $R_1$ to the primary ground of the mining site power distribution system. Resistor $R_1$ is a current limiting resistor that is intended to limit the magnitude of any ground fault current to no more than 50 amps.

Substation 40 includes large oil circuit breakers 33 in each of the phase lines 11, 12 and 13 of cable 10 of the mine power distribution system. The circuit breakers operate to open the phase lines upon detection of a fault in the grounding system by the fault sensor circuit 35, which is the subject of this invention. The oil circuit breakers also operate to open the phase lines upon detection of an overcurrent, in the conventional manner. The ground wires 16, the pilot wire 18, and the metallic shields around the phase conductors (designated by the single conductor S in FIG. 2) all are grounded at point 36 to the primary ground of the substation. As illustrated, sensor circuit 35 is coupled between pilot line 18 and ground point 36.

Cable 10 will extend along the ground, for example, to a distantly located switch house 42 that may be mounted on a sled so that it may be pulled about by a tractor or truck to different locations at the mining site.

The switch house includes an appropriate coupling (not illustrated) to receive a mating coupling for the conductors and wires of cable 10.

Ground conductors 16 and shields S are connected to a common line 45 in switch house 42. A terminating resistor $R_T$ is selectively coupled between the ground lines and pilot line 18 by way of a switching device 50. In practice, switching device 50 may be one or more relays that are held in to provide switch closure during normal operation. Relay 50 may be the relay $K_4$ and $K_5$ illustrated in FIGS. 3 and 5, and which will be described in detail below.

Common ground line 45 is coupled through a series connected impedance $Z_b$ to a ground line 46 that is connected to the chassis of switch house 42. A ground stake 47 provides the local, or secondary, ground for switch house 42. Impedance $Z_b$ is an inductance coil made of large gauge wire that presents a very low impedance at the power frequency of 60 Hertz but presents a large blocking impedance to a fault sensing signal at a frequency of 1000 Hertz, as will be explained in detail below. Blocking impedance $Z_b$ may include a core of magnetic material that operates into magnetic saturation at some given value of 60 Hz fault current. The saturated core prevents the fault voltage across impedance $Z_b$ from exceeding a predetermined limit, thereby preventing a dangerous voltage magnitude from being developed thereacross.

Switch house 42 has internal bus conductors 11c, 12c, 13c and 11d, 12d, 13d that connect the phase lines 11, 12 and 13 of the first section of cable 10 to corresponding phase lines 11', 12', 13' of a second cable 10', and to the corresponding phase lines 11", 12", 13" of a third cable 10". Of course, there will be appropriate mating couplings for coupling the conductors and wires of cables 10' and 10" to the bus lines in the switch house 42.

Switch house 42 includes a fault sensor circuit 35a that is connected between pilot line 18' of cable 10' and common ground line 45' that joins ground lines 16' and shields S' to the ground bus 45a. Output lead 55' of sensor circuit 35a couples the fault sensor circuit to switching means 50 to open the switch in the monitored grounding circuit of cable 10 when sensor circuit 35a senses a fault in cable 10'.

Cable 10' is shown as being coupled to the motors and/or transformers of a machine 59 that might be a power shovel, pump, or a drill, as examples.

A terminating resistor $R_T$ is in pilot line 18' of cable 10', and the blocking impedance $Z_b$ is coupled between the frame, or case, or chassis, of machine 59 and the ground wires 16' and pilot wire 18' of cable 10'. The terminating resistor $R_T$ and blocking impedance $Z_b$ are identical to those previously described.

A third cable 10" to connected to switch house 42 in the same manner as cable 10'. It may be connected to another piece of machinery in the same manner as cable 10', and therefore will not be further described. Another fault sensor circuit 35b, identical to 35 and 35a, is associated with cable 10". Fault sensor circuit 35b will be connected in a grounding circuit that includes a terminating resistor $R_T$ and blocking impedance $Z_b$, in the same manner as previously described for sensor circuits 35 and 35a. Output lead 55" of sensor circuit 35b is coupled to switch means 50 that is in the monitored ground circuit of cable 10.

It will be noted that oil circuit breakers are not included in switch house 42 illustrated in FIG. 2. This is because the oil circuit breakers of the type required are quite large and heavy. Consequently, they may or may not be mounted in the portable switch houses.

Briefly stated, sensor circuit 35 in substation 40 produces a sensing signal at 1,000 Hertz that is circulated in the loop comprised of pilot wire 18, closed switch means 50, terminating resistor $R_T$, ground wires 16 and shields S, to ground point 36 and back to sensor circuit 35. The sensor circuit operates to monitor the resistance and reactance values of the loop. Blocking impedance $Z_b$ is a large inductance coil that blocks the 1,000 Hertz sensing signal from taking a parallel path to ground by way of lines 45 and 46. This effectively confines the sensing signal to the ground sensing circuit of cable 10. Impedance $Z_b$ presents a low value of impedance to the 60 Hertz power on cable 10.

If power cable 10 is in good condition and properly connected, sensor circuit 35 "sees" only the pure resistance value $R_T$ in the monitored ground loop (ignoring the resistance values of the conductors). If a short circuit, open circuit, or any impedance value change greater than two ohms occurs in the ground monitor circuit, sensor circuit 35 will detect it and produce an output signal on line 55 that actuates oil circuit breakers 33 to disconnect phase conductors 11, 12 and 13 from secondary windings 31 of transformer $T_1$. As will be discussed below, sensor circuit 35 also will detect a change to reactance value in the monitored ground loop and will produce an output fault signal when that change exceeds a predetermined limit.

The sensor circuit is constructed and operated to detect a change in resistance of two ohms. The two ohm value was selected because the high power distribution systems at surface mining operations employ 50 ampere fault current limiting resistors (resistor $R_1$, FIG. 2), and 100 volts fault potential is considered to be the maximum value of fault voltage permitted on mining machinery. Consequently, 100 volts divided by 50 amps gives 2 ohms maximum permissible resistance change in the grounding circuit.

The value of $R_T$ is selected to be relatively low, such as 2.5 ohms, so that a resistance change of 2 ohms caused by a fault condition will represent at significant and easily detected difference in the resistance "seen" by the sensor circuit.

Sensor circuits 35a and 35b in switch house 42 function similarly to sensor circuit 35b by detecting faults in the grounding circuits of their respective cables 10' and 10". Their output signals actuate switching means 50 to open the ground sensing circuit in cable 10. Sensing circuit 35 then senses this open circuit and produces a fault signal on output line 55 that opens oil circuit breakers 33.

FIG. 3 is a simplified block diagram of a sensing circuit 35. A 1 kiloHertz signal from oscillator 60 is amplified in power amplifier and driver means 61, is filtered in bandpass filter 62 to block 60 Hz and harmonic components of the 1 kHz signal, and is coupled through the primary winding of current sampling transformer $T_2$ to pilot wire 18 of cable 10. This sensing or monitoring signal circulates in the ground monitoring circuit comprised of pilot wire 18, switching means 50, terminating resistor $R_T$, and ground wire 16. For simplicity, only a single ground wire 16 is illustrated in FIG. 3. In practice, two ground wires and the phase conductor shields S are connected in parallel, as illustrated in FIG. 2.

Voltage transients are suppressed by means of a voltage breakdown device 56, such as a gas discharge tube, that is connected between ground wire 16 and pilot wire 18. For the same purpose, a bipolar semiconductor voltage breakdown device 57 such as a back-to-back Zener diode device, also is connected between the ground and pilot wires. Choke coil 58 in series with pilot wire 18 also is employed for transient suppression.

A sample of the 1 kHz current flowing in the ground monitoring circuit is taken by transformer $T_2$, and a voltage sample of the 1 kHz signal in the ground monitoring circuit is taken at junction point 63. The sampled current signal is coupled from the secondary winding of transformer $T_2$ to the lead 67, is amplified in preamplifier 69, filtered in active bandpass filter 71, and converted to a corresponding d.c. signal by full wave rectifier and filter 73. The voltage signal that is sampled at point 63 is filtered in bandpass filter 65 to block harmonic and 60 Hz signals, is coupled over lead 75 to preamplifier 77, is filtered in active bandpass filter 79, and is converted to a corresponding d.c. signal by full wave rectifier and filter 81.

The sampled current and voltage signals also are coupled over respective leads 67 and 75 and through respective amplifiers 112 and 111 to the inputs of phase detector 113. Because of the use of transformer $T_2$ to sample the 1 kHz current in the ground circuit, the corresponding signal on lead 67 lags the 1 kHz voltage in the ground circuit by 90 degrees when the ground circuit looks purely resistive.

The sensing of any deviation in parameter values in the monitored ground circuit is accomplished by the use of amplitude comparator circuits 90, 92, 94, and by phase detector circuits 113 and 115.

The voltage sample signal Edc is coupled to short circuit detector 90 and is compared with a first d.c. reference voltage $V_{R1}$. Normally, the magnitude of the voltage sample signal Edc is greater than the magnitude of reference signal $V_{R1}$ and the output of the short circuit detector is low. In the presence of a short circuit on pilot wire 18, the sampled voltage Edc will decrease to a magnitude less than $V_{R1}$ and the output of detector 90 will go high. This short circuit signal is coupled over lead 96 to logic circuit 98. Logic circuit 98 includes safety and checking features, as will be described below in connection with FIG. 4. When the sensor circuit is operating properly to detect a fault, the short circuit signal is coupled to a respective relay driver 101a that actuates a respective latching relay $K_1$. The actuation of relay $K_1$ opens its contact $K_{1-1}$, causing driver circuit 103 to be deenergized. Normally energized trip relays $K_4$ and $K_5$ then are deenergized and their contacts open (or close, depending on the logic used) to deenergize the oil circuit breaker 33, and/or open the switching means 50, depending on the arrangement. Trip relays $K_4$ and/or $K_5$ may in fact be the switching means 50.

The magnitudes of the voltage signal Edc and the Idc current signal (actually a voltage) are compared in open circuit detector circuit 92. The parameters of the system are selected so that normally the magnitude of the current signal Idc is greater than voltage signal Edc. Normally, the output of open circuit detector 92 is low. Upon occurrence of an open circuit, the voltage in the monitored ground circuit will rise and the current will fall until the voltage signal Edc exceeds the current signal Idc. Comparator 92 will detect this change in relative magnitudes and its output will go high. This signal is coupled through logic circuit 98 and corresponding driver circuit 101b and actuates respective latching relay $K_2$. Actuation of relay $K_2$ opens its contact $K_{2-1}$ and deenergizes driver circuit 103. As explained above, normally energized trip relays $K_4$ and $K_5$ are deenergized and their contacts open (or close) to cause oil circuit breakers 33, and/or switching means 50, to open.

The sampled voltage signal E on lead 75 and the sampled current signal I are coupled to respective amplifiers 111 and 112, both of which operate into saturation to produce corresponding output square waves at the sensing signal frequency of 1 kHz. As previously mentioned, the a.c. current signal I (actually a voltage) is 90 degrees out of phase with the a.c. voltage signal E when the grounding circuit is in proper condition. Consequently, the two square waves in quadrature relationship are coupled to phase detector 113. Phase detector 113 is an Exclusive Or circuit followed by an integrator or filter so that the d.c. output signal $\phi dc$ is a function of the phase relationship between the E and I input signals. This type of phase detector circuit is conventional and well known to those of ordinary skill in the art. Under normal operating conditions, the output of the Exclusive Or circuit is a repetitive rectangular waveform having a 50% duty cycle.

The output of phase detector 113 is coupled to a phase check circuit 115 and is compared against a reference voltage $V_{R3}$. Normally, reference voltage $V_{R3}$ is smaller in magnitude than a phase detector output signal $\phi dc$ when the monitored ground circuit is in proper condition. The output of phase check circuit 115 normally is low. Upon the occurence of a fault in the ground circuit, such as short near the termination end (end nearest $R_T$) of the monitored ground circuit, the line will appear inductive and the phase between the E and I signals will change sufficiently to cause the output of comparator circuit 115 to go high. The phase change required to make the output of phase check circuit 115 go high is empirically arrived at. This high signal is coupled to logic circuit 98, to a respective driver circuit 101c, and latching relay $K_3$ is energized. Relay contacts $K_{3-1}$ open and driver circuit 103 and trip relays $K_4$ and $K_5$ are deenergized. As explained previously, the contacts of relays $K_4$ and $K_5$ change to cause oil circuit breaker 33 and/or switching means 50 to open.

From the above description it is evident that when the sampled voltage signal E increases beyond a predetermined limit the open circuit detector produces a fault signal, and when the sampled voltage signal falls below a predetermined limit the short circuit detector produces a fault signal. So far, no fault signal will be produced if only the current signal (Idc) goes high. This might occur if a short occurs in the sensor circuitry but not in the monitored grounding circuit. Current line check circuit 94 detects such a condition. It is a comparator circuit whose output signal is low under normal operating conditions during which the magnitude of reference signal $V_{R2}$ exceeds the magnitude of the sampled current signal Idc. In the event that the current signal Idc (actually a voltage) increases in magnitude to exceed $V_{R2}$, the output of current check circuit 94 goes high, thereby producing a fault signal.

The outputs of all of the comparator circuits 90, 92, 94, and 115 are coupled to a secondary trip circuit 120. Secondary trip circuit 120 normally energizes driver circuit 103. When a fault signal is coupled through secondary trip circuit 120 to driver circuit 103, the latter is deenergized, thus causing trip relay $K_4$ to be deenergized. This is a safety feature to assure that trip relay $K_4$ is properly deenergized in case one or more of the driver circuits 101 or latching relays $K_1$, $K_2$, or $K_3$ should fail.

Power Up/Down and Monitor Check Circuit 125 prevents the logic circuitry 93 and the secondary trip circuit 120 from being falsely triggered by transients and unstable conditions when power is first applied to the monitor and when the power drops below a given magnitude. The monitor check portion of circuit 125 prevents trip relays $K_4$ and $K_5$ from being reset in the event the Power Up/Down portion of the circuit becomes disabled.

Figure 4:
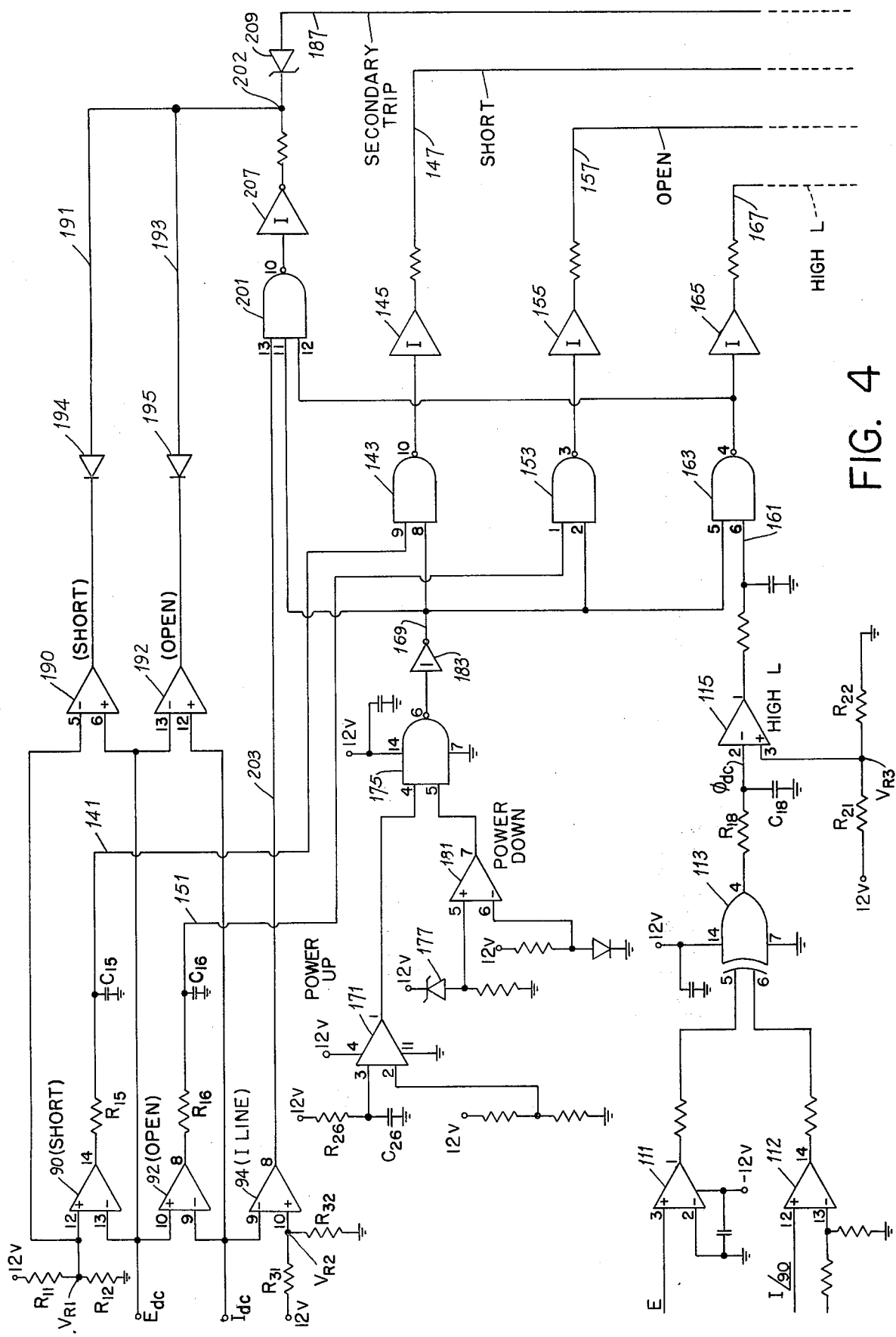
FIG. 4 is a simplified illustration of logic circuitry employed in the sensor circuit of FIG. 3.

Reference now will be made to FIG. 4 which illustrates in more detail the comparator circuits 90, 92, 94, and 115, logic circuit 98 and secondary trip circuit 120 of FIG. 3. Circuits that are to the left of the comparator circuits in FIG. 3 are conventional and well known circuits that one skilled in the art may easily provide. Consequently, those other circuits will not be described in FIG. 4.

The comparator of short circuit detector 90 receives the sampled voltage signal Edc on its negative input pin 13 and the reference voltage $V_{R1}$ is picked off the voltage divider comprised of resistors $R_{11}$, and $R_{12}$ and applied to the positive input pin 12. Under normal operating conditions the two input signals have predetermined magnitudes that are selected so that the magnitude of Edc exceeds $V_{R1}$. In normal operation the output signal from short circuit detector 90 is low. A short in the monitored grounding circuit will cause the magnitude of the sampled voltage signal Edc to fall below the magnitude of reference voltage $V_{R1}$. The output of short circuit detector 90 then will go high. Resistor $R_{15}$ and capacitor $C_{15}$ produce a brief delay of the order of 75-100 msecs. After this delay the short circuit signal is coupled over lead 141 to input pin 9 of NAND gate 143. The other input signal at pin 8 of NAND gate 143 should be high, as will be explained below, so that the output signal on pin 10 of NAND gate 143 will go low upon detection of a short circuit. This low signal is inverted by inverter 145 and appears as a high signal on lead 147.

The comparator of open circuit detector 92 receives the two sampled signals at its respective input pins 10 and 9. Under normal conditions the magnitudes of the input signals are arranged so that the sampled current signal Idc is greater than the magnitude of sampled voltage signal Edc. The output signal of open circuit detector 92 normally is low. An open circuit or an abnormally high resistance value in the pilot wire of the monitored grounding circuit will cause the voltage signal Edc to rise and current signal Idc to decrease. Open circuit detector 92 senses this change and its output goes high. This high signal is delayed by the resistor-capacitor combination $R_{16}$, $C_{16}$ and the delayed high signal is coupled over lead 151 to input pin 1 of NAND gate 153. The other input at pin 2 of NAND gate 153 will be high at this time so that the output signal at pin 3 will go low. Inverter 155 inverts the low signal so that a high signal that indicates the detection of an open circuit or a high resistance will be coupled over lead 157.

Open circuit detector 92 will detect an open circuit in the ground wire 16 and shields S, FIG. 3. When ground wire 16, FIG. 3, is open the 1 kHz signal will attempt to seek ground through blocking impedance $Z_b$. This appears as an abnormally high impedance at 1 kHz and will cause open circuit detector 92 to respond in the manner described above.

The sampled a.c. voltage and current signals E and I/90° are coupled through respective saturating amplifiers 111 and 112 and the squarewave output signals of these amplifiers are coupled to respective input pins 5 and 6 of Exclusive Or (Ex Or) gate 113. Because of the quadrature relationship of the input signals to Ex Or gate 113, the output will be a rectangular waveform whose duty cycle is a function of the phase relationship between the voltage and current input signals. The output of Ex Or gate 113 is smoothed, or filtered, in resistor-capacitor combination $R_{18}$, $C_{18}$, and is applied to the negative input terminal of high L (inductance) comparator 115. The input to input terminal 3 of comparator 115 is reference voltage $V_{R3}$ that is picked off of the voltage divider formed by resistors $R_{21}$ and $R_{22}$. Under normal conditions the magnitude of the phase signal $\phi dc$ at input pin 2 is greater than the input reference voltage $V_{R3}$ and the output of comparator 115 is low.

When an open circuit occurs in the ground wire 16, FIG. 3, the blocking impedance $Z_b$ is in the series circuit to earth ground and causes a phase change to occur between the voltage and current of the 1 kHz sensing signal. Phase detector 113 senses the change of phase and its output signal will decrease in magnitude, and with one or more lengths of 1,000 feet cables, will probably go below the magnitude of reference voltage $V_{R3}$ so that the output of comparator 115 goes high. This change in level of comparator 115 is delayed by delay circuit $R_{24}$, $C_{24}$ and is coupled over lead 161 to input pin 6 of NAND gate 163. The input to pin 5 of NAND gate 163 will be high at this time so that the output signal on pin 4 will go low. Inverter 165 inverts this signal and the line 167 will go high. This fault signal "high L" is in the nature of a back-up or fail-safe signal since the open circuit in ground wire 16 also should be detected by open circuit detector 92.

The second input to each of the NAND gates 143, 153, and 163 are assumed to be a high signal coupled from lead 169. Assuming that the sensor circuit power supply is functioning properly, the signal on lead 169 will remain high except for a brief period after power is first applied. This permits transients to die out before the logic circuitry is enabled. If the power supplied to the sensor should drop below a predetermined level, the signal on lead 169 will go low so as to disable NAND gates 143, 153, 163 and 201. This prevents unstable and erratic operation of the logic circuitry.

The signal on lead 169 is derived as follows. A comparator circuit 171, designated Power Up, has a predetermined reference voltage applied to its negative input pin 2. The voltage applied to its positive input pin 3 is taken from the junction point between resistor $R_{26}$ and capacitor $C_{26}$. When power is first applied, capacitor $C_{26}$ begins to charge from zero volts. Until the charge on capacitor $C_{26}$ reaches some predetermined magnitude, the voltage at negative input pin 2 of comparator 171 is greater than the voltage applied to positive input pin 3. The output signal from comparator 171 under that Power Up condition will be low. That low signal is applied to input pin 4 of NAND gate 175. During this Power Up period before the applied voltage reaches some predetermined magnitude, Zener diode 177 will not conduct so that a low signal is applied to the plus input pin 5 of comparator 181. Some finite magnitude of voltage will be applied at the negative input pin 6 of comparator 181. Consequently, the output of comparator 181 will be low. Both inputs to NAND gate 175 are low during this Power Up period so that its output is high. The output is inverted by inverter 183 and lead 169 is low. The low condition therefore inhibits NAND gates 143, 153, 163 and 201 from passing any signals during the Power Up period. This protective measure minimizes instability in the operation of the sensor circuit and minimizes false triggering due to transients when the circuit is first turned on.

After the power supply has been turned on and its voltage exceeds a given magnitude for a given length of time, capacitor $C_{26}$ will charge up beyond a predetermined magnitude and the voltage at the positive input pin 3 of Power Up comparator 171 will exceed the reference voltage that is applied to the negative input pin 2. The output of comparator 171 then goes high. By this time the power supply voltage will have sufficient magnitude to cause Zener diode 177 to break down. The voltage at pin 5 of comparator 181 now will be higher than that at pin 6 and the output of comparator 181 will go high. Both inputs to NAND gate 175 now are high and its output goes low. Inverter 183 inverts this condition and lead 169 is high, thereby providing enabling signals to each of the NAND gates 143, 153, 163, and 201.

When the magnitude of the power supply voltage drops below a predetermined level that causes Zener diode 177 to cease conducting, the output of Power Down comparator 181 will go low and cause the output of NAND gate 175 to go high. This condition is inverted by inverter 183 so that a low signal on conductor 169 is coupled to each of the NAND gates 143, 153, 163, and 201, thereby disabling each of those NAND gates. Thus, Power Down comparator 181 provides further protection against unstable operating conditions.

As described above, short circuit, open circuit, and high L signals may be provided on each of the respective leads 147, 157, and 167. The fault sensing circuit of the present invention operates to provide a second fault signal on lead 187 when any one of the short, open, or high L fault signals is produced. This second fault signal contributes a redundancy or fail-safe feature to the sensor circuitry of this invention and is produced as follows. The Power Up enabling signal on lead 169 is coupled to input pin 11 of NAND gate 201, and the noninverted high L signal at the output pin 4 of NAND gate 163 is coupled to input pin 12 of NAND gate 143.

The third input signal at pin 13 of NAND gate 201 is the I line output signal on output lead 203 of I line comparator 94. Comparator 94 is intended to detect a short circuit condition in the sensing circuitry that includes amplifier 69, active bandpass filter 71, and full wave rectifier 73, FIG. 3. The reason for this is that a short circuit in these portions of the sensor circuit may not be detected by short circuit detector 90 or open circuit detector 92. Comparator 94 is operated so that under normal conditions the reference voltage $V_{R2}$ that is taken from the voltage divider formed by resistors $R_{31}$ and $R_{32}$ has a greater magnitude than the current signal Idc applied to the negative input of the comparator. Under these normal conditions, the output signal on output lead 203 is high. Upon occurrence of a short circuit, the Idc signal will exceed the $V_{R2}$ signal and the output signal on lead 203 will go low.

Continuing with the inputs to NAND circuit 201, all three inputs signals normally are high. Consequently, the output signal at pin 10 normally is low. This low signal is inverted by inverter 207 and is applied as a high signal to junction point 202 at the cathode of Zener diode 209.

Two additional signals are applied to junction point 202 by way of leads 191 and 193. Lead 191 is coupled through diode 194 to the output pin 7 of redundant short circuit detector 190, and lead 193 is coupled through diode 195 to output pin 14 of redundant open circuit detector 192. It is seen that the respective input signals to the comparators of short circuit detector 190 and open circuit detector 192 are coupled to input pins of opposite polarities as compared to short circuit detector 90 and 92. For example, Edc input signal is coupled to the negative input pin of short circuit comparator 90, but is coupled to the positive input pin of redundant short circuit comparator 190.

Circuit parameters are chosen so that the output signals of the redundant short circuit and open circuit detectors 190 and 191 normally are high and go low in the presence of respective fault conditions. The respective normal high output signals are coupled to the cathodes of diodes 194 and 195 to back bias the diodes and prevent both from conducting. As a result, the signals coupled on leads 191 and 193 to junction point 202 will have no affect on the conduction of Zener diode 209. On the other hand, when a short circuit or open circuit occurs, the output signal of comparator 190 or 192 will go low and will cause one of the diodes 194 or 195 to conduct. The low signal is coupled through a diode to junction point 202. This low condition will cause Zener diode 209 to cease conducting and will cause the secondary trip signal on lead 187 to go low. As will be explained immediately below, this low signal on lead 187 is a ground fault signal.

It may be seen that the redundant or fail-safe circuitry just described is capable of functioning to provide a fault signal on lead 187 even though the comparators 90, 92, 94, the NAND circuits 143, 153, 163, or the inverters 145, 155, 165 might fail.

Figure 5:
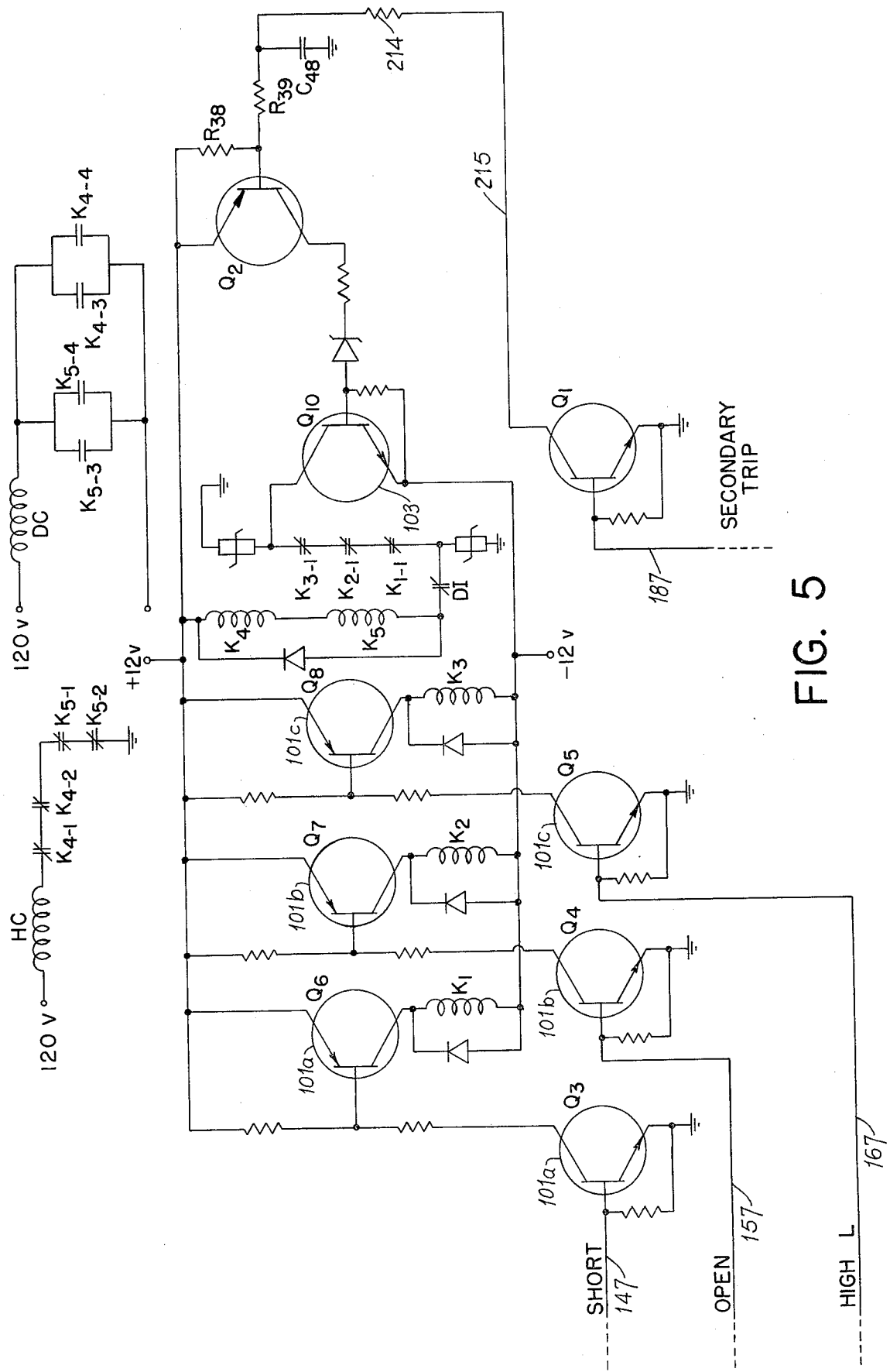
FIG. 5 is a schematic illustration illustrating the relay and switching means employed in the fault sensor system of this invention.

The remainder of the sensor circuitry is illustrated in FIG. 5 wherein short circuit, open circuit, and high L conductors 147, 157, and 167 are shown at the left side of the figure and the secondary trip conductor 187 is shown at the lower right portion of the figure. By way of review, during normal operation in the absence of a fault signal, conductors 147, 157, and 167 will be low and secondary trip conductor 187 will be high. Normally conducting transistor $Q_1$ keeps capacitor $C_{48}$ discharged by way of current limiting resistor 214 and lead 215, and places a low potential on the base of pnp transistors $Q_2$. Transistor $Q_2$ therefore is normally conducting and places a high potential on the base electrode of npn transistor $Q_{10}$ (driver circuit 103, FIG. 3). Transistor $Q_{10}$ therefore conducts by way of a current path from the plus 12 volt supply, through the windings of relays $K_4$ and $K_5$, through the closed contacts DI, $K_{1-1}$, $K_{2-1}$, $K_{3-1}$, through the transistor $Q_{10}$ to the minus 12 volt supply. Contacts DI are door interlock contacts that close when the door to the cabinet that houses the apparatus is closed.

Relays $K_4$ and $K_5$ are the trip relays referred to in FIG. 3. Their contacts $K_{4-1}$, $K_{4-2}$, and $K_{5-1}$, $K_{5-2}$ are in series circuit with holding coil HC. When relay coils $K_4$ and $K_5$ are energized, the 120 volt source energizes holding coil HC to hold in the contacts of the oil circuit breaker, or the contacts of a relay means 50, as the case may be.

The respective pairs of parallel connected contacts $K_{4-3}$, $K_{4-4}$, and $K_{5-3}$, $K_{5-4}$ are held open by energized relay coils $K_4$ and $K_5$. When the relay coils are deenergized, the contacts $K_{4-3}$, $K_{4-4}$, and $K_{5-3}$, $K_{5-4}$ close and the discharge coil DC is energized by a surge of current. The energized discharge coil DC assists in opening the oil circuit breaker contacts, for example.

The particular arrangement and utilization of relays $K_4$ and $K_5$ and their contacts together with their energization means are merely illustrative of possible uses and should not be considered to limit the present invention. Collectively, they may be referred to as circuit control means that control the circuit breakers, relays 50, or other circuit interrupting means. It will be realized that relay $K_5$ is redundant to relay $K_4$ and is used solely as a safety feature.

The short circuit, open circuit, and high L conductors 147, 157, and 167 are coupled to the base electrodes of respective driver transistors $Q_3$, $Q_4$, $Q_5$. Because conductors 147, 157, and 167 normally are low, the npn transistors $Q_3$, $Q_4$, and $Q_5$, normally will be nonconducting. Pnp transistors $Q_6$, $Q_7$, and $Q_8$ have their respective base electrodes connected to the collector electrodes of transistors $Q_3$, $Q_4$, and $Q_5$. Transistors $Q_6$, $Q_7$, and $Q_8$ therefore normally are nonconducting and the coils of latching relays $K_1$, $K_2$, and $K_3$ are unenergized.

Upon the occurrence of any one or more of the fault signals on the conductors 147, 157, or 167, one or more of the driver transistors $Q_3$, $Q_4$, $Q_5$ will conduct and a low potential will be coupled to the base electrode of the corresponding pnp transistor $Q_6$, $Q_7$, $Q_8$. When one or more of these latter transistors conducts, one or more of the windings of latching relays $K_1$, $K_2$, $K_3$ will be energized to open one or more of the contacts $K_{1-1}$, $K_{2-1}$, $K_{3-1}$, thereby deenergizing the winding of trip relays $K_4$ and $K_5$. The deenergization of trip relays $K_4$ and $K_5$ opens their respective relay contacts $K_{4-1}$, $K_{4-2}$, and $K_{5-1}$, $K_{5-2}$. As explained above, the opening of these relay contacts will directly deenergize the oil circuit breakers and/or will open the switching means 50 in a monitored ground circuit so as to produce a fault signal in the next upstream sensor circuit.

If a fault signal were present in the monitored loop, but for some reason a corresponding fault signal was not coupled from the comparator circuits 90, 93, 94, or 115 of FIG. 4 to a respective one of the driver transistors $Q_3$, $Q_4$, and $Q_5$ of FIG. 5, the fault signal on the secondary trip conductor 187, still will cause trip relays $K_4$ and $K_5$ to be deenergized. This occurs after a slight delay in the following manner. A fault signal on secondary trip conductor 187 is a low signal that causes normally conducting transistor $Q_1$ to cease conducting. Capacitor $C_{48}$ then begins to accumulate a charge by way of the plus 12 volt line and resistors $R_{38}$ and $R_{39}$. Capacitor $C_{48}$ and resistors $R_{38}$ and $R_{39}$ are chosen so that in approximately 500 msecs. capacitor $C_{48}$ will accumulate a sufficient charge to cause transistor $Q_2$ to turn off. This in turn causes normally conducting transistor $Q_{10}$ to turn off, thereby deenergizing the windings of trip relays $K_4$ and $K_5$. This secondary trip feature is a redundant or fail-safe feature. It normally will not be the cause for deenergizing relays $K_4$ and $K_5$ since the relays ordinarily are deenergized by way of the opening of the contacts of latching relays $K_1$, $K_2$, and $K_3$.

It will be noted in FIG. 5 that back-to-back Zener diode devices are connected to ground on each side of the series connected relay contacts $K_{1-1}$, $K_{2-1}$, and $K_{3-1}$. This is done to improve the transient immunity of the apparatus. The loads on the heavy machinery used at a mine location frequently are changing, and the machinery and distribution system are out in the open where they are subject to lightening strikes. Therefore, transient suppression is an important consideration and particular attention should be given to it in designing the equipment. State of the art techniques may be used. In addition to the back-to-back Zener devices mentioned herein, additional transient suppressor means may be used to protect the power amplifier and driver 61 and bandpass filter 62, FIG. 3.

Figures 6, 7:
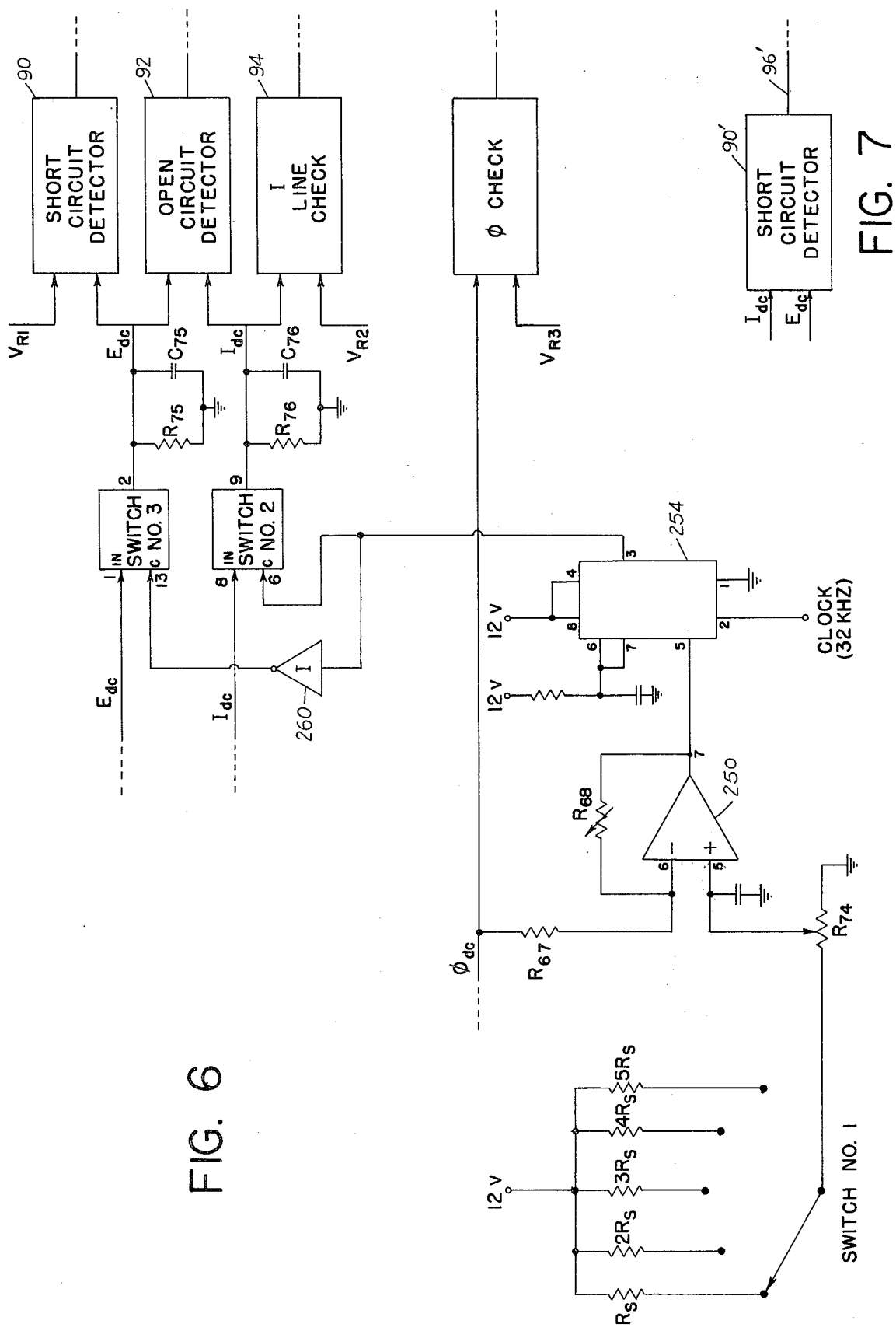
FIG. 6 is a simplified illustration of an alternative embodiment of the portion of a sensor circuit where the sampled voltage and current signals are processed, and illustrates means for compensating the sampled signals to substantially eliminate the effects thereon of inductive reactance in the monitored grounding circuit.
FIG. 7 is a simiplified illustration of a portion of the ground monitoring circuit constructed according to an alternative embodiment.

In the above description of FIGS. 3 and 4, comparators 90, 92, 94, 190 and 192 are "looking at" sampled values of voltage E and current I, and the sensor circuit operates to produce a fault signal when the total resistance in the monitored grounding circuit changes by a value of at least 2 ohms from the normal value. However, the quantities E and I are a function of $X_L$, the inductive reactance in the monitored circuit, as well as its resistance. It can be considered that comparator 92 takes the ratio of E and I. It will be remembered that $E/I = Z$ (impedance), not resistance. Consequently, the circuits of FIGS. 3 and 4 actually are measuring impedance Z changes rather than pure resistance changes. Under most operating conditions the value of inductive reactance $X_L$ in the monitored grounding circuit of a 1,000 feet section of power cable of the type identified above is small enough that its effect may be neglected in the sensor circuitry. There may be some situations and some types of cables where the value of $X_L$ relative to the total resistance of the ground circuit of the cable is sufficiently large that it may not be possible to ignore it. FIG. 6 illustrates in block diagram form an alternative embodiment of a sensor circuit that automatically compensates for any change in $X_L$ so that substantially only resistance is being monitored.

In FIG. 6, the Edc and Idc conductors correspond to the output conductors of full wave rectifiers and filters 81 and 73, respectively, of FIG. 3, and the $\phi$dc conductor corresponds to the output conductor of the phase detector 113, FIG. 3. As explained above in connection with FIG. 4, the phase detector includes the Exclusive Or circuit whose output is a ractangular waveform. Desirably, the duty cycle of the waveform is 50% when the sensor circuit "sees" only the desired value of terminating resistance $R_T$ (neglecting line resistance) in the monitored grounding circuit, i.e., when the E and I outputs are 90° out of phase. That is, the high and low portions of the waveform are of equal duration. As the inductive reactance $X_L$ in the monitored grounding circuit increases, the phase between the E and I signals changes and the duty cycle of the output of the Ex Or circuit changes so that the duration of the high portion of the rectangular waveform decreases and the duration of the low portion increases. After this rectangular waveform is filtered or smoothed by resistor $R_{18}$ and capacitor $C_{18}$, the $\phi$dc signal of decreased magnitude is applied to input pin 6 of operational amplifier 250, FIG. 6. The gain of amplifier 250 is adjustable by means of resistor $R_{68}$ in its feedback circuit. The output signal of operational amplifier 250 also is a function of the bias voltage applied to its other input pin 5. This voltage is a function of the resistance values of adjustable resistor $R_{74}$ and a selected one of the resistors Rs, 2Rs, 3Rs ... 5Rs. The selection of one of the resistors Rs ... 5Rs by switch No. 1 will be discussed below.

Operational amplifier 250 inverts the $\phi$dc input signal applied to its pin 6 and an increased output signal on pin 7 is coupled to input pin 5 of timing circuit 254. Clock pulses at a rate of 32 kHz, for example, are coupled to clock input pin 2 of timing circuit 254. This timing circuit, a SE555V integrated circuit chip, functions in the following manner. A clock pulse input to pin 2 causes output pin 3 to go high. Pin 3 stays high for a time period that is a function of the magnitude of the signal at its input terminal 5. The output at pin 3 of timing circuit 254 is a series of pulses, i.e., a repetitive rectangular waveform, whose positive or high period decreases in duration as the $\phi$dc signal increases in magnitude and whose high period increases in duration as the $\phi$dc signal becomes smaller (before inversion in Op Amp 250).

The repetitive rectangular waveform at pin 3 of timing circuit 254 is coupled to the control input pin 6 of electronic switch circuit No. 2. This control input effectively closes switch No. 2 for the duration of the high portion of the rectangular control signal so that the I signal on input pin 8 is passed through switch No. 2, as a series of pulses whose durations are an inverse function of the magnitude of the $\phi$dc signal. Consequently, as the $\phi$dc signal decreases when the power cable has a larger than normal inductive reactance $X_L$, the duration of pulses of the I signal passed by switch No. 2 will increase. These pulses are smoothed or integrated by the $R_{76}$-$C_{76}$ combination to provide the Idc signal that is coupled to comparators 92 and 94. This Idc signal of increased magnitude compensates for the decrease in I/90° caused by a larger value of $X_L$.

The repetitive rectangular waveform output at pin 3 of timing circuit 254 is inverted in inverter 260 and coupled as the control input signal at input pin 13 of switch No. 3, an electronic switching circuit identical to switch No. 2. Because this control signal is inverted relative to the control signal applied to switch No. 2, the output at pin 2 of switch No. 3 is a series of pulses of the E signal whose durations are a direct function of the magnitude of the $\phi$ signal. Consequently, as $X_L$ increases and causes a decrease in the magnitudes of the E and the $\phi$ signals, the pulses at pin 3 of switch No. 3 become shorter in duration, thereby automatically compensating for the lower values of E and $\phi$dc. After smoothing or filtering in the $R_{75}$-$C_{75}$ combination, the Edc signal is applied to comparators 90 and 92.

The values of resistors Rs, 2Rs . . . 5Rs are so chosen that their values will cause operational amplifier 250 to operate properly for respective number of cables being monitored. That is, resistor Rs is used when just one length of power cable is in the ground monitoring circuit. Resistor 2Rs is selected when two lengths of cable are connected together in the monitoring circuit, and so on until resistor 5Rs is chosen when five lengths of cable are connected together. Alternatively, respective printed circuit boards may be provided having a different resistor value Rs thereon. A respective board is used for each different cable length(s) used.

In FIG. 3, the test for an open circuit was made by comparing the Edc and Idc signals. The comparison of these two signals has the advantage that both will change in like manner if the magnitudes of the sampled E and I signals should change because of an unstable or changing power supply voltage in the sensor. Because both signals will change in like manner, the change will be substantially eliminated in the output of comparator 92.

It is noted that the short circuit detector 90 compares the Edc voltage against a reference voltage $V_{R1}$. These two voltages may not change in like manner as a result of a change in power supply voltage of the sensor. Although the arrangement illustrated in FIG. 3 operates satisfactorily, under some conditions it may be desirable to perform the short circuit test by comparing the Edc and Idc signals. That is, in the alternative embodiment of FIG. 7, under normal operating conditions, the magnitude of the Edc signal exceeds the magnitude of the Idc signal and the output signal on lead 96' normally is low. Upon occurrence of a short circuit in the monitored circuit, the voltage signal Edc will decrease and the current signal Idc will increase. Short circuit detector circuit 90', a comparator circuit, is adjusted so that at predetermined changes in the values of the two input signals the output signal on lead 96' will go high. This circuit then will have the inherent advantage that the E and I voltages will change in like manner with a change in power supply voltage in the sensor circuit.

Listed below are some representative circuit components that were used in the apparatus of this invention.

| | |
|---|---|
| NAND 143, 153, 163 | MC14011BCLD (Motorola) |
| NAND 175, 201 | MC14023BCLD (Motorola) |
| Comparators 111, 112, 115, 90, 92, 14, 171, 181, 190, 192 | MC3303BCBS (Motorola) |
| EX OR 113 | MC14070BCLD (Motorola) |
| $Q_1$, $Q_{10}$ | 200N0038-02 |
| $Q_3$, $Q_4$, $Q_5$ | 200N0021 |
| $Q_2$, $Q_6$, $Q_7$, $Q_8$ | 200N0022 |
| Relay $K_1$, $K_2$, $K_3$ | MA11112-3 (Potter & Brumfield) |
| Relay $K_4$ | MH9134Z-4 (Potter & Brumfield) |
| Relay $K_5$ | MH80910 (Potter & Brumfield) |
| Transformer $T_2$ | 39T032 (Thordarson-Meissner) |
| Bidirectional transient suppressors | 1CTE15C (General Semiconductor) |

In its broader aspects, this invention is not limited to the specific embodiment illustrated and described. Various changes and modifications may be made without departing from the inventive principles herein disclosed.

What is claimed is:

1. In a ground wire sensor circuit for use with an electrical power cable that includes power conductors, at least one ground wire and at least one other wire that is not a power conductor, wherein said ground wire and other wire are joined together at one end of the power cable by a resistance means of given value, and wherein a sensing signal is coupled between the other ends of the ground and other wires to form a ground wire monitoring loop, said sensing signal being at a sensing frequency that is substantially different from that of the electrical power to be carried on the power conductors, and wherein the cable is connected to a source of power through circuit interrupting means, the method of testing the electrical condition of said loop, comprising the steps substantially blocking the sensing signal from leaving the loop at a region on the ground wire that is adjacent said resistance means, sampling the sensing signal voltage on said loop and producing a sampled voltage signal in response thereto, sampling the sensing signal current in said loop and producing a sampled current signal in response thereto, comparing the sampled voltage and current signals and producing a comparison output signal when a predetermined relationship exists between the compared signals, changing the condition of a circuit control means in response to the production of a comparison output signal, opening said circuit interrupting means to disconnect the power conductors of said cable from said source of power to response to said circuit control means changing conditions.

2. The method claimed in claim 1 wherein the step of comparing the sampled voltage and current signals includes producing a comparison output signal when an increase in said sampled voltage signal and a decrease in said sampled current signal establish said predetermined relationship therebetween, thereby to provide an indication of an open circuit or a higher than normal resistance condition in said ground monitoring loop.

3. The method claimed in claim 1 wherein said step of comparing the sampled voltage and current signals includes producing a respective comparison output signal when a decrease in said sampled voltage signal and an increase in said sampled current signal establish said predetermined relationship therebetween, thereby to provide an indication of a short circuit or a lower than normal resistance condition in said ground monitoring loop.

4. The method claimed in claims 1, 2 or 3 wherein said step of comparing the sampled voltage and current signals includes comparing the phases of said sampled voltage and current signals to produce a respective comparison output signal when the phase relationship between the compared signals exceeds predetermined limits, and changing the condition of said circuit control means in response to said respective comparison output signal.

5. The method claimed in claims 1 or 2 wherein said method includes the steps producing a first trip signal in response to said comparison output signal, producing a second trip signal in response to said comparison output signal, said second trip signal being delayed in time relative to the first trip signal, coupling said first and second trip signals to said circuit control means, changing the condition of said circuit control means in response to said first trip signal or in response to the delayed second trip signal if the condition of the circuit control means has not been previously changed.

6. The method of testing claimed in claim 1 wherein said predetermined relationship between the sampled voltage and current signals is a relationship that is established when the resistance value of the ground monitoring loop changes by at least two ohms from the resistance value of a properly connected and properly operating ground monitoring loop.

7. The method claimed in claim 1 and including the steps comparing the phases of the sampled voltage and current signals in said loop and producing a phase signal having a characteristic that varies as a function of the phase relationship between the sampled voltage and current signals, controlling the magnitudes of the sampled voltage and current signals in response to said phase signal to substantially eliminate undesired changes in magnitudes of the sampled voltage and current signals caused by reactive conditions within predetermined limits in the monitored loop.

8. In a ground wire sensor circuit for use with an electrical power cable that includes power conductors, at least one ground wire and at least one other wire that is not a power conductor, wire, wherein said ground wire and other wire are joined together at one end of the power cable by a resistance means of given value, and wherein a sensing signal is coupled between the other ends of the ground wire and pilot wires to form a ground monitoring loop, said sensing signal being at a sensing frequency that is substantially different from that of the electrical power to be carried on the power conductors, the combination comprising means presenting a high impedance to said sensing signal coupled to the ground wire adjacent said resistance means to substantially confine the sensing signal to said loop, means for sampling the sensing signal voltage on said ground monitoring loop and for producing a sampled voltage signal in response thereto, means for sampling the sensing signal current in said ground monitoring loop and for producing a sampled current signal in response thereto, means for comparing said sampled voltage signal with said sampled current signal and for producing a comparison output signal when a predetermined relationship exists between the compared signals, circuit control means having at least first and second operating conditions, and means responsive to said comparison output signal for changing the operating condition of the circuit control means from its first to its second operating condition upon occurrence of said comparison output condition.

9. In a ground wire sensor circuit for use with an electrical power cable that includes power conductors, at least one ground wire and a ground check, or pilot, wire, wherein said ground wire and pilot wire are joined together at one end of the power cable by a resistance means of given value, and wherein a sensing signal is coupled between the other ends of the ground and pilot wires to form a ground wire monitoring loop, said sensing signal being at a sensing frequency that is substantially different from that of the electrical power to be carried on the power conductors, the combination comprising means presenting a high impedance to said sensing signal coupled to the ground wire adjacent said resistance means to substantially confine the sensing signal to said loop, means for sampling the sensing signal voltage on said ground monitoring loop and for producing a sampled voltage signal in response thereto, means for sampling the sensing signal current in said ground monitoring loop and for producing a sampled current signal in response thereto, means for comparing said sampled voltage signal with said sampled current signal and for changing a first comparison output signal from a first to a second value when an increase in the sampled voltage signal and a decrease in the sampled current signal meets a predetermined relationship, thereby to provide an open circuit signal, means for comparing said sampled voltage signal against another signal to produce a second comparison output when a decrease in the magnitude of the sampled voltage signal relative to said another signal meets a given relationship, thereby to provide a short circuit signal, control means having at least first and second conditions for controlling the application of power to said cable, means responsive to at least one of said open or short circuit signals for changing the condition of said control means for interrupting the application of power to the power conductors of said cable upon occurrence of said open or short circuit signals.

10. The combination claimed in claim 9 wherein said another signal against which the sampled voltage signal is compared to provide a short circuit signal is a predetermined reference voltage.

11. The combination claimed in claim 9 wherein said another signal is said sampled current signal.

12. The combination claimed in claims 10 or 11 and further including second means responsive to at least one of said open or short circuit signals for changing the condition of said control means, said second means including delay means for delaying its operation until after said first-named means that is responsive to at least one of said open or short circuit signals normally would operate if functioning properly.

13. The combination claimed in claims 10 or 11 and further including means for comparing the phases of the sampled voltage and current signals and for producing a phase signal that has a characteristic that is a function of the phase relationship between the sampled voltage and current signals, means responsive to said phase signal and to said sampled voltage and current signals for producing output voltage and current signals whose magnitudes are compensated for changes in magnitudes of said sampled voltage and current signals caused by reactance conditions within predetermined limits in said monitored loop.

14. The combination claimed in claims 10 or 11 and further including phase detector means responsive to voltage and current samples of the sensing signal in said loop for producing a phase signal having a characteristic that changes as a function of the phase relationship between the voltage and current in said loop, means for coupling said phase signal to said first-named and said second means that are responsive to at least one of said open or short circuit signals for changing the condition of said control means when said characteristic of the phase signal changes by a predetermined amount.

15. The combination claimed in claim 14 and further including second means responsive to at least one of said open or short circuit signals, or said phase signal for changing the condition of said control means, said second means including delay means for delaying its operation until after said first named means that is responsive to at least one of said open or short circuit signals or said phase signal normally would operate if functioning properly.

16. The combination claimed in claim 8 or 9 wherein said means presenting a high impedance to said sensing signal presents a low impedance to electrical power current that flows on the power conductors.

17. In a ground wire sensor circuit for use with an electrical power cable that includes power conductors, at least one ground wire and at least one other wire that is not a power conductor, wherein said ground wire and other wire are joined together at one end of the power cable by a resistance means of given value, and wherein a sensing signal is coupled between the other ends of the ground and other wires to form a ground wire monitoring loop, said sensing signal being at a sensing frequency that is substantially different from that of the electrical power to be carried on the power conductors, and wherein the power conductors of the cable are connected to a source of power through circuit interrupting means, the method of testing the electrical condition of said loop, comprising the steps substantially blocking the sensing signal from leaving the loop at a region on the ground wire that is adjacent said resistance means, sampling the sensing signal voltage on said loop and producing a sampled voltage signal in response thereto, sampling the sensing signal current in said loop and producing a sampled current signal in response thereto, determining when either one or both of the sampled voltage and current signals deviates from a predetermined condition and producing a corresponding comparison signal in response thereto, changing the condition of a circuit control means in response to the production of a comparison output signal, said circuit control means being adapted to control said circuit interrupting means that connects the power conductors to a source of power.

18. In a ground wire sensor circuit for use with an electrical power cable that includes power conductors, at least one ground wire and at least one other wire that is not a power conductor, wherein said ground wire and other wire are joined together at one end of the power cable by a resistance means of given value, and wherein a sensing signal is coupled between the other ends of the ground and other wires to form a ground wire monitoring loop, said sensing signal being at a sensing frequency that is substantially different from that of the electrical power to be carried on the power conductors, and wherein the power conductors of the cable are connected to a source of power through circuit interrupting means and power utilization means is coupled to said one end of the cable, the method of testing the electrical condition of said loop, comprising the steps substantially blocking the sensing signal from flowing to earth ground from the end of said loop adjacent the resistance means, sampling the sensing signal voltage on said loop and producing a sampled voltage signal in response thereto, sampling the sensing signal current in said loop and producing a sampled current signal in response thereto, comparing the sampled voltage and current signals and producing a comparison output signal when a predetermined relationship exists between the compared signals, and changing the condition of a circuit control means in response to the production of a comparison output signal, said circuit control means being adapted to control said circuit interrupting means that connects the power conductors to a source of power.

* * * * *